(12) United States Patent
Kawashima et al.

(10) Patent No.: US 11,274,972 B2
(45) Date of Patent: Mar. 15, 2022

(54) SEMICONDUCTOR DEVICE

(71) Applicant: Denso Corporation, Kariya (JP)

(72) Inventors: Takanori Kawashima, Anjo (JP); Hitoshi Ozaki, Toyota (JP)

(73) Assignee: Denso Corporation, Kariya (JP)

( * ) Notice: Subject to any disclaimer, the term of this patent is extended or adjusted under 35 U.S.C. 154(b) by 499 days.

(21) Appl. No.: 16/266,508

(22) Filed: Feb. 4, 2019

(65) Prior Publication Data

US 2019/0242757 A1   Aug. 8, 2019

(30) Foreign Application Priority Data

Feb. 6, 2018   (JP) .............................. JP2018-019589

(51) Int. Cl.
*G01K 7/01* (2006.01)
*H01L 23/34* (2006.01)
*H01L 23/433* (2006.01)
*H01L 23/495* (2006.01)

(52) U.S. Cl.
CPC .............. *G01K 7/015* (2013.01); *H01L 23/34* (2013.01); *H01L 23/4334* (2013.01); *H01L 23/49503* (2013.01); *H01L 23/49541* (2013.01); *H01L 23/49568* (2013.01); *H01L 23/49575* (2013.01)

(58) Field of Classification Search
CPC ...... G01K 7/01; G01K 2217/00; G01K 1/026; G01K 7/425; G01K 5/486; G01K 7/028; G01K 7/186; G01K 7/346; G01K 7/016; G01K 7/015; G01K 7/00; G01K 7/20; G01J 5/0007; H01L 2924/13091; H01L 21/67248; H01L 22/30; H01L 23/49524; H01L 24/73; H01L 25/072; H01L 23/34; H01L 23/4334; H01L 23/49503; H01L 23/49541; H01L 23/49568; H01L 23/49575; H01L 29/7869; H01L 23/50; H01L 2224/06; H01L 2224/49113
USPC ................................................. 374/170, 178
See application file for complete search history.

(56) References Cited

U.S. PATENT DOCUMENTS

| | | | |
|---|---|---|---|
| 7,872,337 B2 * | 1/2011 | Tsunoda | H01L 24/40 257/678 |
| 9,754,854 B2 * | 9/2017 | Otremba | H01L 23/49562 |
| 10,168,233 B2 * | 1/2019 | Furutani | G01K 7/01 |
| 10,283,440 B2 * | 5/2019 | Soyano | H01L 23/3735 |

(Continued)

FOREIGN PATENT DOCUMENTS

| JP | 2008-270293 A | 11/2008 |
|---|---|---|
| JP | 2011-086889 A | 4/2011 |

(Continued)

*Primary Examiner* — Gail Kaplan Verbitsky
(74) *Attorney, Agent, or Firm* — Dinsmore & Shohl LLP (57) ABSTRACT

A semiconductor device includes a first semiconductor element, a first signal terminal group, and a second signal terminal group disposed at an interval from the first signal terminal group. The first semiconductor element includes a control signal electrode to which a control signal for the first semiconductor element is input, and a temperature signal electrode that outputs a signal corresponding to temperature of the first semiconductor element. The temperature signal electrode is connected with a temperature signal terminal included in the first signal terminal group, and the control signal electrode is connected with a first control signal terminal included in the second signal terminal group.

17 Claims, 5 Drawing Sheets

(56) References Cited

U.S. PATENT DOCUMENTS

| | | | |
|---|---|---|---|
| 10,615,102 B2* | 4/2020 | Takagi | H01L 24/06 |
| 11,011,443 B2* | 5/2021 | Suwa | H01L 23/28 |
| 2002/0167017 A1* | 11/2002 | Nakabayashi | G02B 6/4201 |
| | | | 257/98 |
| 2006/0233116 A1* | 10/2006 | Kyusojin | H04L 69/161 |
| | | | 370/252 |
| 2011/0089558 A1 | 4/2011 | Muto et al. | |
| 2015/0270240 A1* | 9/2015 | Tokubo | H01L 24/49 |
| | | | 257/77 |
| 2018/0166549 A1* | 6/2018 | Kato | H01L 23/50 |
| 2018/0204779 A1* | 7/2018 | Yasuda | H01L 23/49582 |
| 2019/0067251 A1* | 2/2019 | Bando | H01L 23/473 |
| 2019/0189537 A1* | 6/2019 | Fujino | H01L 23/49524 |
| 2019/0295929 A1* | 9/2019 | Takagi | H01L 24/33 |
| 2020/0083129 A1* | 3/2020 | Fujino | H01L 24/40 |
| 2020/0294925 A1* | 9/2020 | Yamada | H01L 25/18 |

FOREIGN PATENT DOCUMENTS

| | | | |
|---|---|---|---|
| JP | 2015-122876 A | 7/2015 | |
| JP | 6069831 B2 * | 2/2017 | |
| JP | 2017-147316 A | 8/2017 | |
| WO | 2018/020953 A1 | 1/2018 | |
| WO | WO-2018207656 A1 * | 11/2018 | H01L 23/48 |

* cited by examiner

SEMICONDUCTOR DEVICE

CROSS-REFERENCE TO RELATED APPLICATIONS

This application claims priority to Japanese Patent Application No. 2018-019589 filed on Feb. 6, 2018, which is incorporated herein by reference in its entirety including the specification, drawings and abstract.

BACKGROUND

1. Technical Field

The technology disclosed in this specification relates to a semiconductor device.

2. Description of Related Art

Japanese Unexamined Patent Application Publication No. 2017-147316 (JP 2017-147316 A) discloses a semiconductor device. The semiconductor device includes a first semiconductor element, a second semiconductor element, a first signal terminal group, and a second signal terminal group. The second signal terminal group is disposed at an interval from the first signal terminal group. The first signal terminal group is connected with a plurality of signal electrodes of the first semiconductor element, and the second signal terminal group is connected with a plurality of signal electrodes of the second semiconductor element.

SUMMARY

In the foregoing semiconductor device, one corresponding signal terminal group is connected with each of the semiconductor elements. In each of the signal terminal groups, a plurality of signal terminals is disposed adjacent to one another. Therefore, the two neighboring signal terminals may have an influence of noise from one another. In particular, when the signal terminal connected with a temperature signal electrode of the semiconductor element is adjacent to the signal terminal connected with a control signal electrode of the semiconductor element, temperature of the semiconductor element may not be measured accurately due to an influence of noise.

A semiconductor device according to a first aspect disclosed in this specification includes a first semiconductor element, a first signal terminal group, and a second signal terminal group disposed at an interval from the first signal terminal group. The first semiconductor element includes a control signal electrode to which a control signal for the first semiconductor element is input, and a temperature signal electrode that outputs a signal corresponding to temperature of the first semiconductor element. The temperature signal electrode is connected with a temperature signal terminal included in the first signal terminal group, and the control signal electrode is connected with a first control signal terminal included in the second signal terminal group.

In the foregoing aspect, the first semiconductor element may further include a current signal electrode that outputs a signal corresponding to current flowing in the first semiconductor element, and the current signal electrode may be connected with a first current signal terminal included in the second signal terminal group.

In the foregoing aspect, the semiconductor device according to the aspect may further include a second semiconductor element adjacent to one side of the first semiconductor element. The second semiconductor element may include a control signal electrode to which a control signal for the second semiconductor element is input. The control signal electrode of the second semiconductor element may be connected with a second control signal terminal included in the first signal terminal group. The first signal terminal group may further include another signal terminal between the temperature signal terminal and the second control signal terminal.

In the foregoing aspect, the second semiconductor element may further include a current signal electrode that outputs a signal corresponding to current flowing in the second semiconductor element. The current signal electrode of the second semiconductor element may be connected with a second current signal terminal that is included in the first signal terminal group and positioned between the temperature signal terminal and the second control signal terminal.

In the foregoing aspect, the temperature signal terminal and the second control signal terminal may be disposed separately on both ends of the first signal terminal group, respectively.

In the foregoing aspect, the semiconductor device according to the aspect may further include a sealing body that seals the first semiconductor element and the second semiconductor element. The temperature signal terminal may have a portion bent or curved towards the first semiconductor element inside the sealing body. The second control signal terminal may have a portion bent or curved towards the second semiconductor element inside the sealing body. The bent or curved portion of the temperature signal terminal and the bent or curved portion of the second control signal terminal may be bent or curved in different directions from each other.

In the foregoing aspect, the second semiconductor element may further include a temperature signal electrode that outputs a signal corresponding to temperature of the second semiconductor element, and the temperature signal electrode of the second semiconductor element may not be connected with any signal terminal.

In the foregoing aspect, the semiconductor device according to the aspect may further include a third semiconductor element adjacent to the other side of the first semiconductor element. The third semiconductor element may include a control signal electrode to which a control signal for the third semiconductor element is input. The control signal electrode of the third semiconductor element may be connected with a third control signal terminal included in the second signal terminal group.

In the foregoing aspect, the second signal terminal group may further include another signal terminal between the first control signal terminal and the third control signal terminal.

A semiconductor device according to a second aspect disclosed in this specification includes a first semiconductor element, a second semiconductor element adjacent to one side of the first semiconductor element, a third semiconductor element adjacent to the other side of the first semiconductor element, a first signal terminal group having five signal terminals, and a second signal terminal group that is disposed at an interval from the first signal terminal group and has six signal terminals. Each of the first semiconductor element, the second semiconductor element, and the third semiconductor element includes a control signal electrode, two temperature signal electrodes, and two current signal electrodes. A control signal for each of the first semiconductor element, the second semiconductor element, and the third semiconductor element is input to the control signal electrode. The two temperature signal electrodes output a signal corresponding to temperature of each of the first semiconductor element, the second semiconductor element, and the third semiconductor element. The two current signal electrodes output a signal corresponding to current flowing in each of the first semiconductor element, the second semiconductor element, and the third semiconductor element. The two temperature signal electrodes of the first semiconductor element are connected with two temperature signal terminals included in the first signal terminal group. The control signal electrode of the first semiconductor element is connected with a first control signal terminal included in the second signal terminal group. The two current signal electrodes of the first semiconductor element are connected with two first current signal terminals, respectively, the first current signal terminals being included in the second signal terminal group and adjacent to the first control signal terminal. The two temperature signal electrodes of the second semiconductor element are not connected with any signal terminal. The control signal electrode of the second semiconductor element is connected with the second control signal terminal included in the first signal terminal group. The two current signal electrodes of the second semiconductor element are connected with the two current signal terminals, respectively, included in the first signal terminal group and positioned between the second control signal terminal and the two temperature signal terminals. The two temperature signal electrodes of the third semiconductor element are not connected with any signal terminal. The control signal electrode of the third semiconductor element is connected with a third control signal terminal that is included in the second signal terminal group and adjacent to the two first current signal terminals. The two current signal electrodes of the third semiconductor element are connected with two third current signal terminals, respectively, the third current signal terminals being included in the second signal terminal group and adjacent to the third control signal terminals.

With the foregoing aspect, the temperature signal electrode of the first semiconductor element is connected with the temperature signal terminal in the first signal terminal group, and the control signal electrode of the first semiconductor element is connected with the first control signal terminal in the second signal terminal group. In such a configuration, the temperature signal terminal and the first control signal terminal are disposed separately from each other, and it is thus possible to restrain an influence of noise that the temperature signal terminal receives from the first control signal terminal. Thus, it becomes possible to measure temperature of the first semiconductor element accurately, and it is possible to appropriately control the first semiconductor element while avoiding overheating of the first semiconductor element.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

In an embodiment of the technology, a first semiconductor element may further include a first current signal electrode that outputs a signal corresponding to current flowing in the first semiconductor element. In this case, the current signal electrode may be connected with a first current signal terminal included in a second signal terminal group. With this configuration, a temperature signal terminal and the first current signal terminal are disposed separately from each other, and it is thus possible to restrain an influence of noise that the temperature signal terminal receives from the first current signal terminal.

In the embodiment of the technology, a semiconductor device may further include a second semiconductor element adjacent to one side of the first semiconductor element. The second semiconductor element may have a control signal electrode to which a control signal for the second semiconductor element is input. The control signal electrode of the second semiconductor element may be connected with a second control signal terminal included in a first signal terminal group. Then, the first signal terminal group may further include another signal terminal between the temperature signal terminal and the second control signal terminal. Thus, the first signal terminal group may include the second control signal terminal connected with the second semiconductor element, in addition to the temperature signal terminal connected with the first semiconductor element. As another signal terminal is interposed between the temperature signal terminal and the second control signal terminal, the temperature signal terminal and the second control signal terminal are disposed separately from each other. Therefore, it is possible to restrain an influence of noise that the temperature signal terminal connected with the first semiconductor element receives from the second control signal terminal connected with the second semiconductor element.

In the embodiment of the technology, the second semiconductor element may further include a current signal electrode that outputs a signal corresponding to current flowing in the second semiconductor element. In some embodiments, the current signal electrode of the second semiconductor element is connected with a second current signal terminal included in the first signal terminal group, and the second current signal terminal is positioned between the temperature signal terminal and the second control signal terminal. This means that another signal terminal of the first signal terminal group described above is not particularly limited, but may be the second current signal terminal connected with the second semiconductor element.

In the embodiment of the technology, the temperature signal terminal and the second control signal terminal may be disposed separately from each other on both ends of the first signal terminal group, respectively. In other words, all of the signal terminals included in the first signal terminal group may be positioned between the temperature signal terminal and the second control signal terminal. With such a configuration, a distance between the temperature signal terminal and the second control signal terminal becomes large, and it is possible to further restrain an influence of noise that the temperature signal terminal receives from the second control signal terminal.

In the embodiment of the technology, the semiconductor device may further include a sealing body that seals the first semiconductor element and the second semiconductor element. In this case, the temperature signal terminal may have a portion bent or curved towards the first semiconductor element inside the sealing body, and the second control signal terminal may include a portion bent or curved towards the second semiconductor element inside the sealing body. Then, the bent or curved portion of the temperature signal terminal and the bent and curved portion of the second control signal terminal may be bent or curved in different directions from each other.

With the foregoing configuration, a distal end of the temperature signal terminal connected with the first semiconductor element can be close to the first semiconductor element, and, at the same time, a distal end of the second control signal terminal connected with the second semiconductor element can be close to the second semiconductor element. In addition, since two or more signal terminals included in the same first signal terminal group are bent or curved in different directions from each other, the first signal terminal group is fixed to the sealing body more firmly. Thus, when, for example, the first signal terminal group is attached to and removed from an external connector, endurance of the first signal terminal group against a load (tensile load or pressing load) is improved.

In the embodiment of the technology, the second semiconductor element may further include a temperature signal electrode that outputs a signal corresponding to temperature of the second semiconductor element. In this case, the temperature signal electrode of the second semiconductor element may not be connected with any signal terminal. With this technology, since it is possible to measure temperature of the first semiconductor element accurately, temperature measurement of the second semiconductor element may be omitted. Thus, it is possible to reduce the number of signal terminals required in the semiconductor device, and it is thus possible to reduce a size of the semiconductor device. As another embodiment, the second semiconductor element may be a semiconductor element without a temperature signal electrode, unlike the first semiconductor element.

In the embodiment of the technology, the semiconductor device may further include a third semiconductor element adjacent to the other side of the first semiconductor element. The third semiconductor element may include a control signal electrode to which a control signal for the third semiconductor element is input. Then, the control signal electrode of the third semiconductor element may be connected with a third control signal terminal included in the second signal terminal group. With such a configuration, since the third control signal terminal is disposed separately from the temperature signal terminal included in the first signal terminal group, an influence of noise that the temperature signal terminal receives from the third control signal terminal is restrained.

In the embodiment of the technology, the second signal terminal group may further include another signal terminal between the first control signal terminal and the third control signal terminal. With such a configuration, even when the first control signal terminal and the third control signal terminal are included in the same second signal terminal group, the first control signal terminal and the third control signal terminal are disposed separately from each other.

Therefore, it is possible to restrain an influence of noise that the first control signal terminal and the third control signal terminal receive from each other. For example, another signal terminal described above may be a signal terminal connected with the first semiconductor element, such as the first current signal terminal.

A semiconductor device 10 according to an example is described with reference to the drawings. For example, the semiconductor device 10 may be used for a power conversion circuit such as a converter and an inverter of an electric vehicle. The electric vehicle herein widely means a vehicle having a motor that drives wheels, and includes an electric vehicle charged with external power, a hybrid vehicle having an engine in addition to a motor, and a fuel-cell vehicle in which a fuel cell serves as a power source.

As shown in FIG. 1 to FIG. 4, the semiconductor device 10 includes a first conductor plate 12, a second conductor plate 14, and a plurality of semiconductor elements 22, 24, 26, and a sealing body 16. The first conductor plate 12 and the second conductor plate 14 are parallel to each other and also face each other. For example, the semiconductor elements 22, 24, 26 include the first semiconductor element 22, the second semiconductor element 24, and the third semiconductor element 26. The first semiconductor element 22 is positioned between the second semiconductor element 24 and the third semiconductor element 26, and the semiconductor elements 22, 24, 26 are arrayed along a longitudinal direction of the first conductor plate 12 and the second conductor plate 14 (a lateral direction in FIG. 2 and FIG. 3). The semiconductor elements 22, 24, 26 are disposed in parallel between the first conductor plate 12 and the second conductor plate 14. The semiconductor elements 22, 24, 26 are sealed by the sealing body 16.

Figure 1:
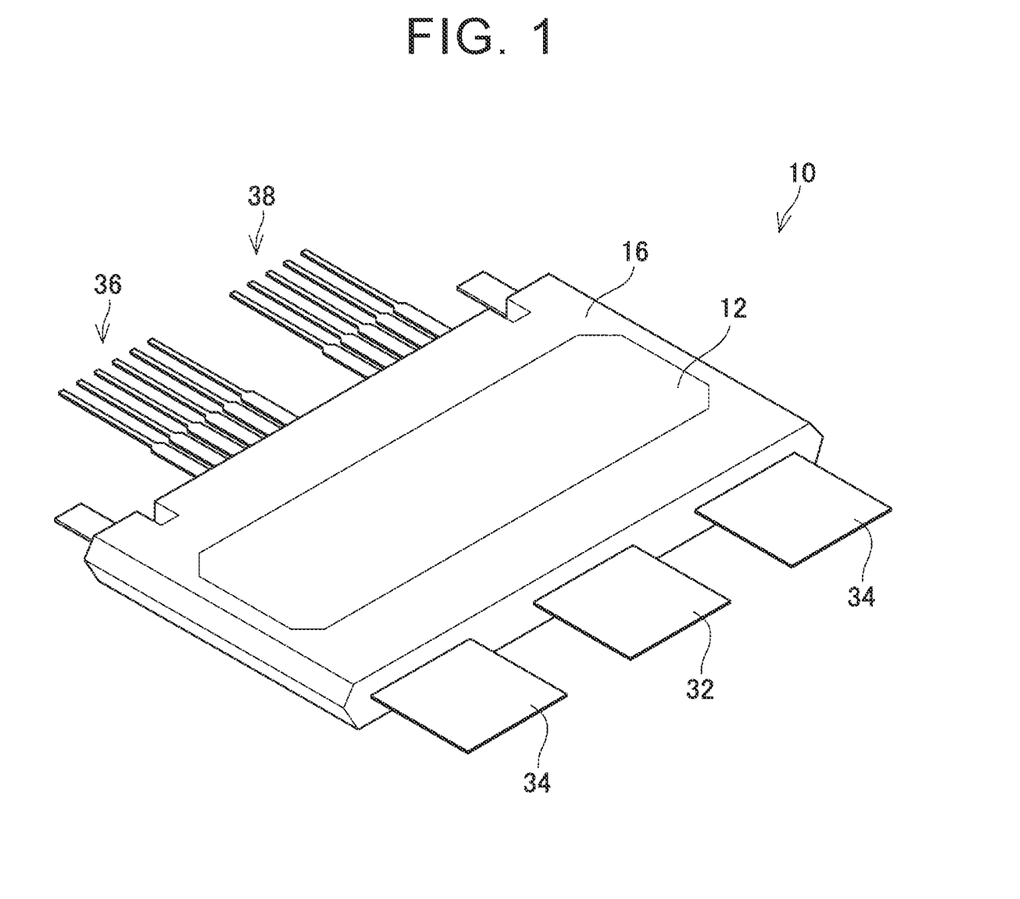
FIG. 1 is a perspective view of an external appearance of a semiconductor device 10.
Figure 2:
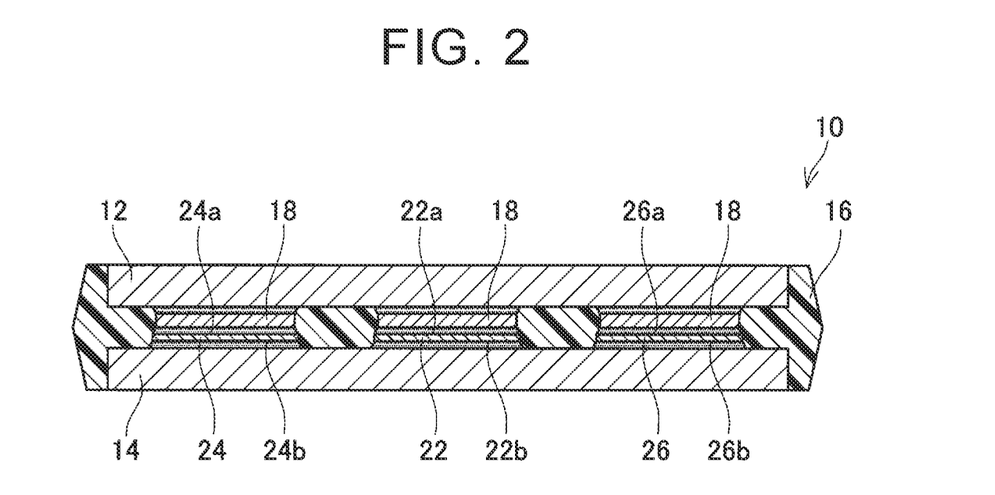
FIG. 2 is a view of a section structure of the semiconductor device 10.
Figure 3:
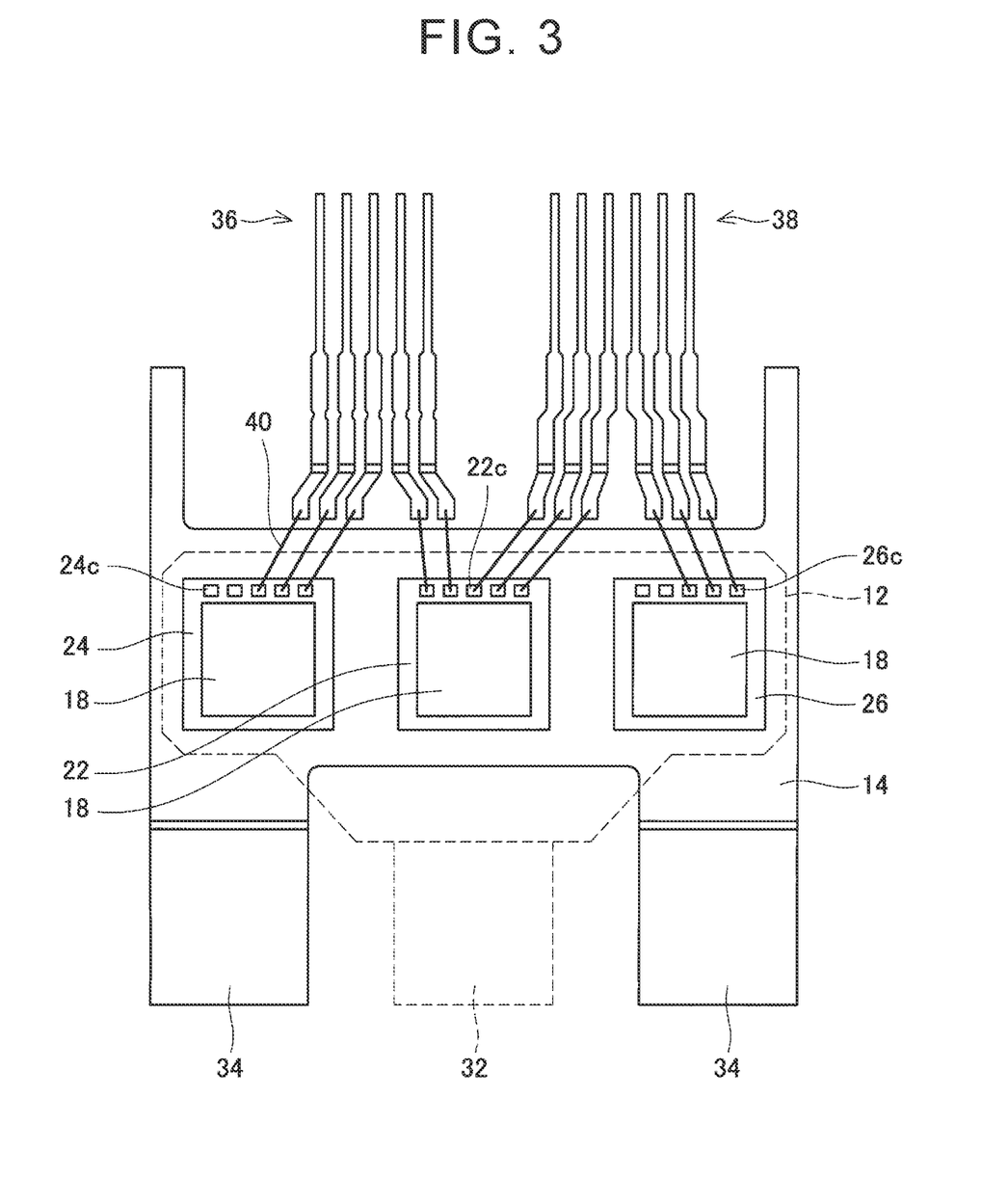
FIG. 3 is a plan view of an internal structure of the semiconductor device 10 where some components are not shown.
Figure 4:
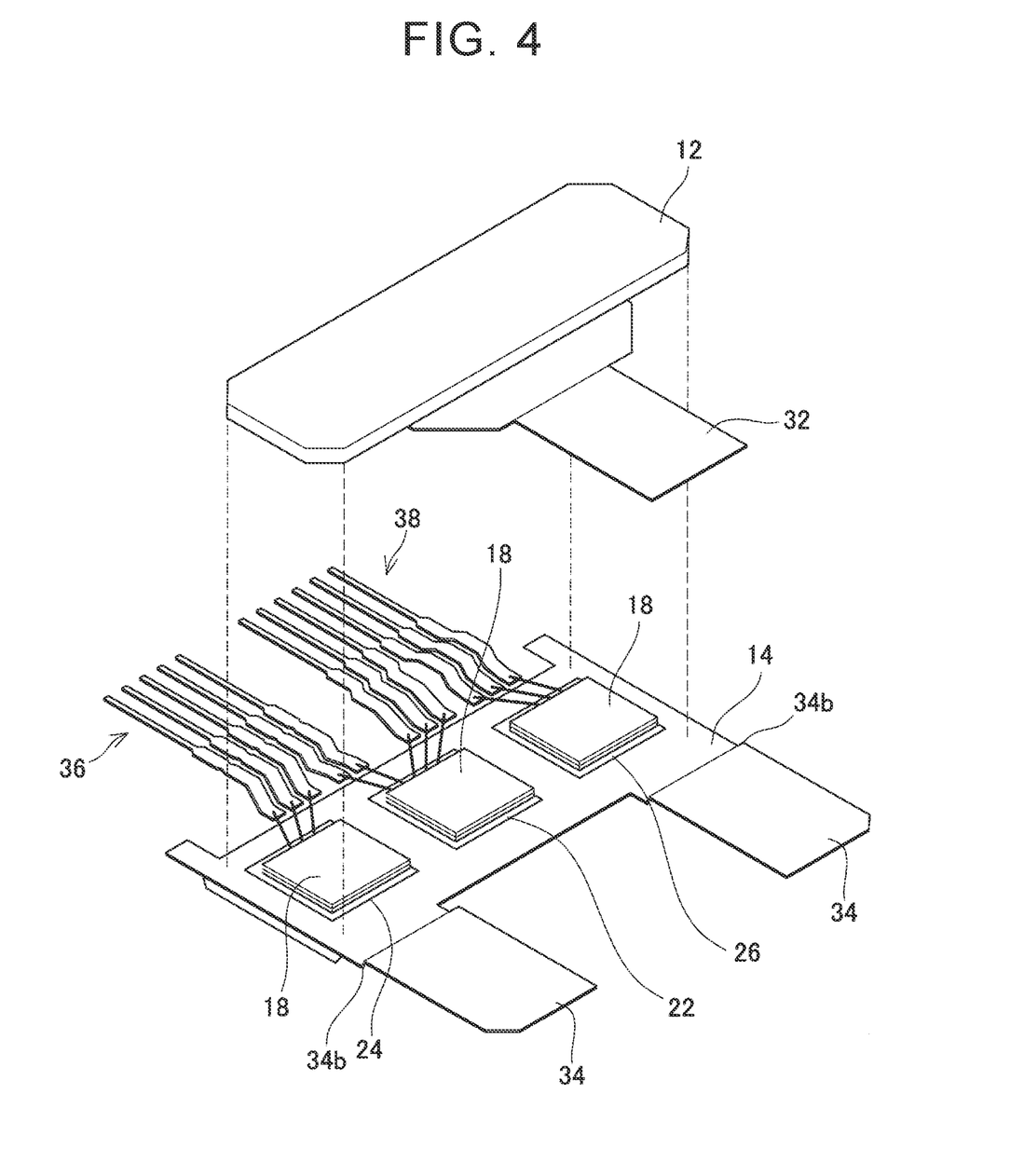
FIG. 4 is an exploded view of the internal structure of the semiconductor device 10 where some components are not shown.

The first conductor plate 12 and the second conductor plate 14 are made of a conductor such as copper, or other metals. The first conductor plate 12 and the second conductor plate 14 face each other through the semiconductor elements 22, 24, 26. Each of the semiconductor elements 22, 24, 26 is joined to first conductor plate 12, and also joined to the second conductor plate 14. A conductor spacer 18 is provided between each of the semiconductor elements 22, 24, 26 and the first conductor plate 12. Specific configurations of the first conductor plate 12 and the second conductor plate 14 are not particularly limited. For example, at least one of the first conductor plate 12 and the second conductor plate 14 may be an insulated substrate such as a direct bonded copper (DBC) substrate that has an intermediate layer made of an insulator (for example, ceramics). Thus, each of the first conductor plate 12 and the second conductor plate 14 does not need to be made of a conductor entirely.

The first semiconductor element 22, the second semiconductor element 24, and the third semiconductor element 26 are so-called power semiconductor elements for a power circuit, and have the same configuration. The first semiconductor element 22 includes an upper surface electrode 22a, a lower surface electrode 22b, and a plurality of signal electrodes 22c. The upper surface electrode 22a and the lower surface electrode 22b are power electrodes, and the signal electrodes 22c are electrodes for signals. The upper surface electrode 22a and the signal electrodes 22c are positioned on an upper surface of the first semiconductor element 22, and the lower surface electrode 22b is positioned on a lower surface of the first semiconductor element 22. The upper surface electrode 22a is electrically connected with the first conductor plate 12 through the conductor spacer 18, and the lower surface electrode 22b is electrically connected with the second conductor plate 14. Similarly, the second semiconductor element 24 and the third semiconductor element 26 include upper surface electrodes 24a, 26a, the lower surface electrodes 24b, 26b, and pluralities of signal electrodes 24c, 26c, respectively. The upper surface electrodes 24a, 26a are electrically connected with the first conductor plate 12 through conductor spacers 18, respectively, and the lower surface electrodes 24b, 26b are electrically connected with second conductor plate 14.

For example, each of the semiconductor elements 22, 24, 26 according to the example includes an insulated gate bipolar transistor (IGBT) structure having an emitter and a collector. The emitters in the IGBT structures are connected with the upper surface electrodes 22a, 24a, 26a, respectively, and the collectors in the IGBT structures are connected with the lower surface electrodes 22b, 24b, 26b, respectively. However, specific types and structures of the semiconductor elements 22, 24, 26 are not particularly limited. Each of the semiconductor elements 22, 24, 26 may be a reverse conducting (RC)—IGBT element that further includes a diode structure. Alternatively, each of the semiconductor elements 22, 24, 26 may have, for example, a metal-oxide-semiconductor field-effect transistor (MOSFET) structure instead of, or in addition to the IGBT structure. A semiconductor material used for the semiconductor elements 22, 24, 26 is not particularly limited either, and may be silicon (Si), silicon carbide (SiC), or nitride semiconductor such as gallium nitride (GaN).

The sealing body 16 is not particularly limited, but may be made of thermosetting resin such as epoxy resin, or other insulator. The sealing body 16 is also referred to as, for example, mold resin or a package. The semiconductor device 10 includes the three semiconductor elements 22, 24, 26, but may also be provided with more semiconductor elements. In such a case, the semiconductor elements are also sealed by the single sealing body 16, and arrayed in parallel to each other between the first conductor plate 12 and the second conductor plate 14.

The first conductor plate 12 and the second conductor plate 14 are not only electrically connected with the semiconductor elements 22, 24, 26, but also thermally connected with the semiconductor elements 22, 24, 26. Also, the first conductor plate 12 and the second conductor plate 14 are exposed on surfaces of the sealing body 16, respectively, and able to dissipate heat of each of the semiconductor elements 22, 24, 26 to outside the sealing body 16. Thus, the semiconductor device 10 according to the example has a double-sided cooling structure in which heat sinks are disposed on both sides of each of the semiconductor elements 22, 24, 26, respectively.

The semiconductor device 10 further includes a first power terminal 32 and two second power terminals 34. Each of the power terminals 32, 34 is made of a conductor such as copper or aluminum. Each of the power terminals 32, 34 is a so-called lead and extends from an inside through an outside of the sealing body 16. The first power terminal 32 is connected with the first conductor plate 12 inside the sealing body 16. Each of the second power terminals 34 is connected with the second conductor plate 14 inside the sealing body 16. Thus, the semiconductor elements 22, 24, 26 are electrically connected with each other in parallel between the first power terminal 32 and each of the second power terminals 34. For example, the first power terminal 32 is joined to the first conductor plate 12 by soldering, and each of the second power terminals 34 is formed integrally with the second conductor plate 14. However, the first power terminal 32 may be formed integrally with the first power terminal 32. Also, each of the second power terminals 34 may be joined to the second conductor plate 14 by, for example, soldering.

The semiconductor device 10 further includes a first signal terminal group 36 and a second signal terminal group 38. Each of signal terminals 36, 38 is made of a conductor such as copper or aluminum. Each of the signal terminals 36, 38 is a so-called lead, and extends from the inside through the outside of the sealing body 16. In the first signal terminal group 36, the signal terminals are arrayed at equal intervals along the array direction of the semiconductor elements 22, 24, 26. In the second signal terminal group 38, the signal terminals are arrayed at equal intervals along the array direction of the semiconductor elements 22, 24, 26. The second signal terminal group 38 is disposed separately from the first signal terminal group 36. This means that a distance between the first signal terminal group 36 and the second signal terminal group 38 is larger than the interval between the signal terminals within the first signal terminal group 36, and also larger than the interval between the signal terminals within the second signal terminal group 38. For example, the first signal terminal group 36 has five signal terminals, and the second signal terminal group 38 has six signal terminals. The signal terminals 36, 38 are connected with the corresponding signal electrodes 22c, 24c, 26c of the semiconductor elements 22, 24, 26 through bonding wires 40, respectively. However, the signal terminals 36, 38 may be connected with the corresponding signal electrodes 22c, 24c, 26c, respectively, without the bonding wires 40.

Figure 5:
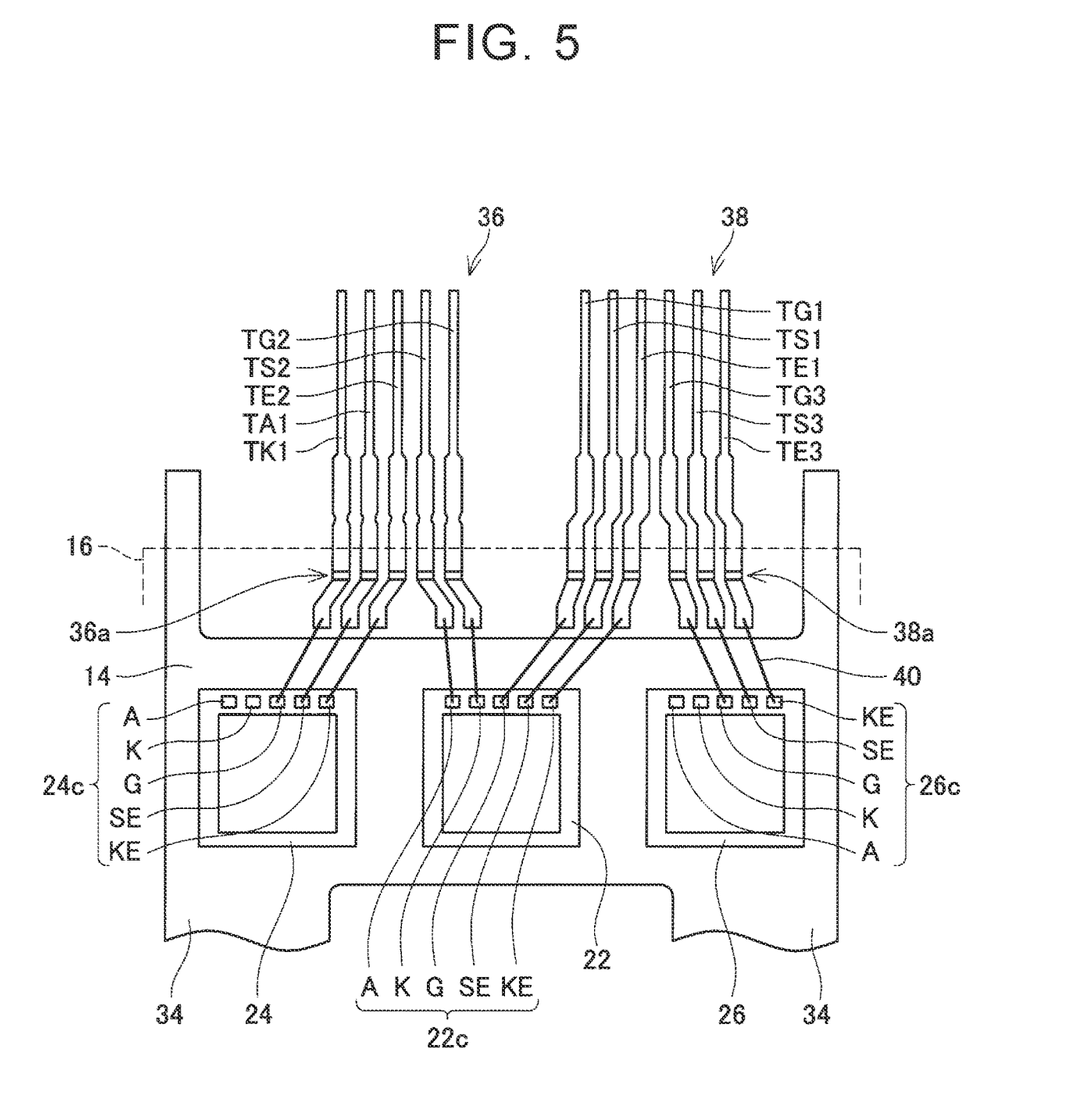
FIG. 5 is a view describing connection between signal electrodes A, K, G, SE, KE of semiconductor elements 22, 24, 26 and first and second signal terminal groups 36, 38.

As shown in FIG. 5, the first semiconductor element 22 includes one control signal electrode G, two temperature signal electrodes A, K, and two current signal electrodes SE, KE as the signal electrodes 22c described above. The control signal electrode G is a signal electrode to which a control signal for the first semiconductor element 22 is input. For example, the control signal electrode G according to the example is connected with a gate of the IGBT structure inside the first semiconductor element 22, and a gate driving signal from outside is input to the control signal electrode G. The two temperature signal electrodes A, K are signal electrodes that output signals corresponding to temperature of the first semiconductor element 22. For example, the temperature signal electrodes A, K according to the example are connected with a temperature sensor (for example, a thermistor) provided inside the first semiconductor element 22. The two current signal electrodes SE, KE are signal electrodes that output signals corresponding to current flowing in the first semiconductor element 22. In the example, one of the current signal electrodes SE is connected with an emitter of an IGBT structure for current detection provided in the first semiconductor element 22, and the other current signal electrode KE is connected with the upper surface electrode 22a (that is an emitter of a main IGBT structure of the first semiconductor element 22). Thus, signal current in a magnitude corresponding to current flowing in the first semiconductor element 22 is allowed to flow between the two current signal electrodes SE, KE. Specific configurations of the signal electrodes G, A, K, SE, KE are not particularly limited.

Similarly, the second semiconductor element 24 includes one control signal electrode G, two temperature signal electrodes A, K, and two current signal electrodes SE, KE as the signal electrodes 24c described above. The control signal electrode G is a signal electrode to which a control signal for the second semiconductor element 24 is input. The two temperature signal electrodes A, K are signal electrodes that output signals corresponding to temperature of the second semiconductor element 24. Then, the two current signal electrodes SE, KE are signal electrodes that output signals corresponding to current flowing in the second semiconductor element 24. The third semiconductor element 26 also includes one control signal electrode G, two temperature signal electrodes A, K, and two current signal electrodes SE, KE as the signal electrodes 26c described earlier. The control signal electrode G is a signal electrode to which a control signal for the third semiconductor element 26 is input. The two temperature signal electrodes A, K are signal electrodes that output signals corresponding to temperature of the third semiconductor element 26. Then, the two current signal electrodes SE, KE are signal electrodes that output signals corresponding to current flowing in the third semiconductor element 26. For the second semiconductor element 24 and the third semiconductor element 26, specific configuration of each of the signal electrodes G, A, K, SE, KE is not particularly limited.

The two temperature signal electrodes A, K of the first semiconductor element 22 are connected with two temperature signal terminals TS2, TG2 included in the first signal terminal group 36, respectively. The control signal electrode G of the first semiconductor element 22 is connected with a first control signal terminal TG1 included in the second signal terminal group 38. The two current signal electrodes SE, KE of the first semiconductor element 22 are connected with two first current signal terminals TS1, TE1 included in the second signal terminal group 38, respectively. The two first current signal terminals TS1, TE1 are adjacent to the first control signal terminal TG1. Therefore, in the first semiconductor element 22, some of the signal electrodes 22c are connected with the first signal terminal group 36, and the rest of the signal electrodes 22c are connected with the second signal terminal group 38.

The two temperature signal electrodes A, K of the second semiconductor element 24 are not connected with any signal terminal. The control signal electrode G of the second semiconductor element 24 is connected with a second control signal terminal TK1 included in the first signal terminal group 36. The two current signal electrodes SE, KE of the second semiconductor element 24 are connected with two second current signal terminals TA1, TE2 included in the first signal terminal group 36, respectively. The two second current signal terminals TA1, TE2 are positioned between the second control signal terminal TK1, and the two temperature signal terminals TS2, TG2. Thus, in the second semiconductor element 24, some of the signal electrodes 24c are connected with the first signal terminal group 36, and the rest of the signal electrodes 24c are not connected with any signal terminal.

The two temperature signal electrodes A, K of the third semiconductor element 26 are not connected with any signal terminal. The control signal electrode G of the third semiconductor element 26 is connected with a third control signal terminal TG3 included in the second signal terminal group 38. The third control signal terminal TG3 is adjacent to the two first current signal terminals TS1, TE1. The two current signal electrodes SE, KE of the third semiconductor element 26 are connected with two third current signal terminals TS3, TE3 included in the second signal terminal group 38, respectively. The two third current signal terminals TS3, TE3 are adjacent to the third control signal terminal TG3.

In the semiconductor device 10 according to the example, the temperature signal electrodes A, K of the first semiconductor element 22 are connected with the temperature signal terminals TS2, TG2 included in the first signal terminal group 36, respectively, and the control signal electrode G of the first semiconductor element 22 is connected with the first control signal terminal TG1 included in the second signal terminal group 38. With such a configuration, the temperature signal terminals TS2, TG2 and the first control signal terminal TG1 are disposed separately from each other. Therefore, it is possible to restrain an influence of noise that the temperature signal terminals TS2, TG2 receive from the first control signal terminal TG1. Hence, when the semiconductor device 10 is employed for an electric apparatus such as a hybrid vehicle, it is possible to measure temperature of the first semiconductor element 22 accurately, and it is also possible to control the first semiconductor element 22 appropriately while avoiding overheating of the first semiconductor element 22. In the semiconductor device 10 according to the example, the first semiconductor element 22 has the two temperature signal electrodes A, K. However, the number of the temperature signal electrodes A, K may be one, three or more. It is the same for the number of the temperature signal terminals TS2, TG2. The number of the control signal electrode G, and the number of the first control signal terminal TG1 are not limited to one, and may be two or more.

In the semiconductor device 10 according to the example, the current signal electrodes SE, KE of the first semiconductor element 22 are connected with the two first current signal terminals TS1, TE1 included in the second signal terminal group 38, respectively. With the configuration, the first current signal terminals TS1, TE1 are disposed separately from the temperature signal terminals TS2, TG2 included in the first signal terminal group 36. Therefore, it is also possible to restrain an influence of noise that the temperature signal terminals TS2, TG2 receive from the first current signal terminals TS1, TE1. The number of the current signal electrodes SE, KE, and the number of the first current signal terminals TS1, TE1 are not limited to two, and may be one, three or more. Alternatively, the first semiconductor element 22 does not need to include the current signal electrodes SE, KE. In such a case, the first current signal terminal TS1, TE1 connected with the current signal electrodes SE, KE, respectively, are not necessary either.

In the semiconductor device 10 according to the example, the control signal electrode G of the second semiconductor element 24 is connected with the second control signal terminal TK1 included in the first signal terminal group 36. Here, the first signal terminal group 36 includes the temperature signal terminals TS2, TG2 described above, and if the second control signal terminal TK1 is adjacent to the temperature signal terminals TS2, TG2, the temperature signal terminals TS2, TG2 can receive an influence of noise from the second control signal terminal TK1. Regarding this point, in the semiconductor device 10 according to the example, the second current signal terminals TA1, TE2 connected with the second semiconductor element 24 are positioned between the temperature signal terminals TS2, TG2 and the second control signal terminal TK1. Because other signal terminals like the second current signal terminals TA1, TE2 are present between the temperature signal terminals TS2, TG2 and the second control signal terminal TK1, the temperature signal terminals TS2, TG2 and the second control signal terminal TK1 are disposed separately from each other. Therefore, it is possible to restrain an influence of noise that the temperature signal terminals TS2, TG2 connected with the first semiconductor element 22 receive from the second control signal terminal TK1 connected with the second semiconductor element 24. As another embodiment, the semiconductor device 10 does not necessarily include the second semiconductor element 24. In this case, the signal terminals TK1, TA1, TE2 connected with the second semiconductor element 24 are not necessary either.

In the semiconductor device 10 according to the example, the temperature signal terminals TS2, TG2 and the second control signal terminal TK1 are disposed separately from each other at both ends of the first signal terminal group 36, respectively. However, the disclosure is not limited to this. With such a configuration, a distance between the temperature signal terminals TS2, TG2 and the second control signal terminal TK1 becomes large, and it is possible to further restrain an influence of noise that the temperature signal terminals TS2, TG2 receive from the second control signal terminal TK1.

In the semiconductor device 10 according to the example, the temperature signal electrodes A, K of the second semiconductor element 24 are not connected with any signal terminal. This means that temperature of the second semiconductor element 24 cannot be measured. With the semiconductor device 10 according to the example, since it is possible to measure temperature of the first semiconductor element 22 accurately, temperature measurement of the second semiconductor element 24 can be omitted. Thus, the number of the signal terminals 36, 38 required for the semiconductor device 10 is reduced, thereby reducing a size of the semiconductor device 10. As another embodiment, unlike the first semiconductor element 22, the second semiconductor element 24 may be a semiconductor element without the temperature signal electrodes A, K.

In the semiconductor device 10 according to the example, the control signal electrode G of the third semiconductor element 26 is connected with the third control signal terminal TG3 included in the second signal terminal group 38. With such a configuration, the third control signal terminal TG3 is disposed separately from the temperature signal terminals TS2, TG2 included in the first signal terminal group 36. Therefore, it is possible to restrain an influence of noise that the temperature signal terminals TS2, TG2 receive from the third control signal terminal TG3. As another embodiment, the third control signal terminal TG3 may be positioned in the same signal terminal group as the temperature signal terminals TS2, TG2 (for example, the first signal terminal group 36). In some embodiments, another signal terminal is interposed between the temperature signal terminals TS2, TG2 and the third control signal terminal TG3. As yet another embodiment, the semiconductor device 10 does not necessarily include the third semiconductor element 26. In this case, the signal terminals TG3, TS3, TE3 connected with the third semiconductor element 26 are not necessary either.

In the semiconductor device 10 according to the example, the second signal terminal group 38 includes the first control signal terminal TG1 connected with the first semiconductor element 22, and the third control signal terminal TG3 connected with the third semiconductor element 26. If the first control signal terminal TG1 and the third control signal terminal TG3 are adjacent to each other, they could receive an influence of noise from one another. Regarding this point, in the semiconductor device 10 according to the example, the first current signal terminals TS1, TE1 are disposed between the first control signal terminal TG1 and the third control signal terminal TG3. Since other signal terminals like the first current signal terminals TS1, TE1 are interposed between the first control signal terminal TG1 and the third control signal terminal TG3, the first control signal terminal TG1 and the third control signal terminal TG3 are disposed separately from each other. Thus, it is possible to restrain an influence of noise that the first control signal terminal TG1 and the third control signal terminal TG3 receive from one another.

In the semiconductor device 10 according to the example, each of the terminals in the first signal terminal group 36 has a bent or curved portion 36a inside the sealing body 16. Some of the terminals in the first signal terminal group 36 are bent or curved towards the first semiconductor element 22 inside the sealing body 16, and some of the terminals in the first signal terminal group 36 are bent or curved towards the second semiconductor element 24 inside the sealing body 16. For example, the temperature signal terminals TS2, TG2 are bent or curved towards the first semiconductor element 22. Meanwhile, the second control signal terminal TK1 and the second current signal terminals TA1, TE2 are bent or curved towards the second semiconductor element 24. Therefore, the bent or curved portions 36a of the temperature signal terminals TS2, TG2, or the bent or curved portion 36a of the second control signal terminal TK1 (or the second current signal terminals TA1, TE2) are bent or curved in different directions from each other.

With the configuration described above, distal ends of the temperature signal terminals TS2, TG2 connected with the first semiconductor element 22 can be close to the first semiconductor element 22, and a distal end of the second control signal terminal TK1 (or the second current signal terminals TA1, TE2) connected with the second semiconductor element 24 can be close to the second semiconductor element 24. In addition, two or more signal terminals included in the same first signal terminal group 36 are bent or curved in different directions from each other. Therefore, the first signal terminal group 36 is fixed to the sealing body 16 relatively firmly. Thus, when, for example, the first signal terminal group 36 is attached to and removed from an external connector, endurance of the first signal terminal group 36 against a load (tensile load or pressing load) is improved.

Similarly, each of the terminals of the second signal terminal group 38 has a bent or curved portion 38a inside the sealing body 16. Some of the terminals of the second signal terminal group 38 are bent or curved towards the first semiconductor element 22 inside the sealing body 16, and some of the terminals of the second signal terminal group 38 are bent or curved towards the third semiconductor element 26 inside the sealing body 16. For example, the first control signal terminal TG1 and the first current signal terminal TS1, TE1 are bent or curved towards the first semiconductor element 22. Meanwhile, the third control signal terminal TG3 and the third current signal terminals TS3, TE3 are bent or curved towards the third semiconductor element 26. Therefore, the bent or curved portions 38a of the first control signal terminal TG1 and the first current signal terminals TS1, TE1, and the bent or curved portions 38a of the third control signal terminal TG3 and the third current signal terminals TS3, TE3 are bent or curved in different directions from each other. Since two or more signal terminals included in the same second signal terminal group 38 are bent or curved in different directions from each other, the second signal terminal group 38 is fixed to the sealing body 16 relatively firmly. Therefore, when, for example, the second signal terminal group 38 is attached to or removed from an external connector, endurance of the second signal terminal group 38 against a load (tensile load or pressing load) is improved.

Figure 6:
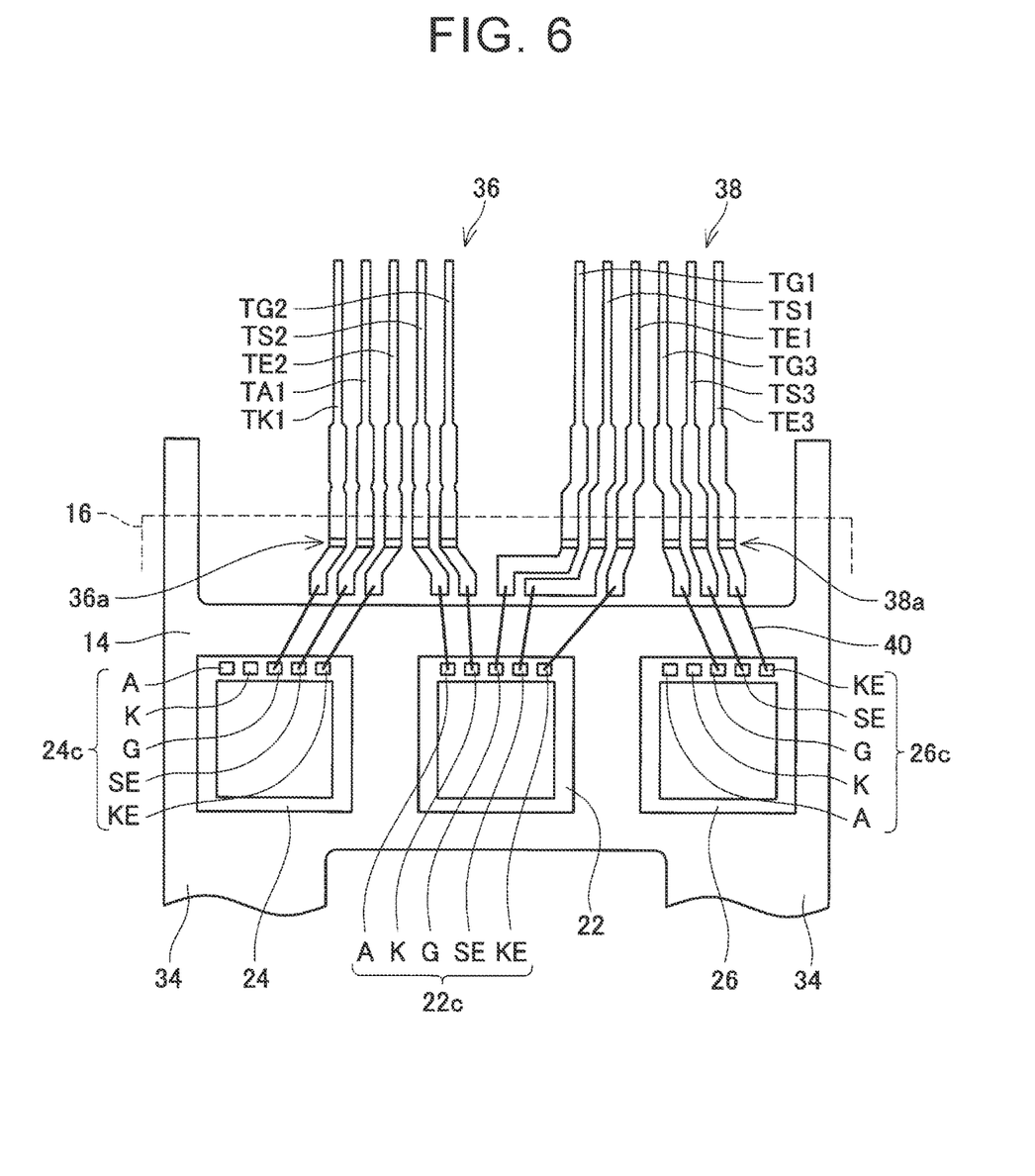
FIG. 6 is a view of a modification of the semiconductor device 10.

FIG. 6 shows another embodiment of the semiconductor device 10. In the embodiment shown in FIG. 6, shapes of the bent or curved portions 36a of the first control signal terminal TG1 and the first current signal terminal TS1 are changed. As described above, the shapes of the bent or curved portions 36a, 38a of the signal terminals 36, 38 may be changed as appropriate depending on, for example, a positional relation among the semiconductor elements 22, 24, 26.

What is claimed is:

1. A semiconductor device, comprising:
    a first semiconductor element;
    a first signal terminal group; and
    a second signal terminal group disposed at an interval from the first signal terminal group, the second signal terminal group is independent from the first signal terminal group, wherein:
    the first semiconductor element includes:
        a control signal electrode to which a control signal for the first semiconductor element is input; and
        a temperature signal electrode that outputs a signal corresponding to temperature of the first semiconductor element;
    the temperature signal electrode is connected with a temperature signal terminal included in the first signal terminal group; and
    the control signal electrode is connected with a first control signal terminal included in the second signal terminal group.

2. The semiconductor device according to claim 1, wherein:
    the first semiconductor element further includes a current signal electrode that outputs a signal corresponding to current flowing in the first semiconductor element; and
    the current signal electrode is connected with a first current signal terminal included in the second signal terminal group.

3. The semiconductor device according to claim 1, further comprising a second semiconductor element adjacent to one side of the first semiconductor element, wherein:
    the second semiconductor element includes a control signal electrode to which a control signal for the second semiconductor element is input;
    the control signal electrode of the second semiconductor element is connected with a second control signal terminal included in the first signal terminal group; and
    the first signal terminal group further includes another signal terminal between the temperature signal terminal and the second control signal terminal.

4. The semiconductor device according to claim 3, wherein:
    the second semiconductor element further includes a current signal electrode that outputs a signal corresponding to current flowing in the second semiconductor element; and
    the current signal electrode of the second semiconductor element is connected with a second current signal terminal that is included in the first signal terminal group and positioned between the temperature signal terminal and the second control signal terminal.

5. The semiconductor device according to claim 3, wherein the temperature signal terminal and the second control signal terminal are disposed separately on both ends of the first signal terminal group, respectively.

6. The semiconductor device according to claim 3, further comprising a sealing body that seals the first semiconductor element and the second semiconductor element, wherein:
    the temperature signal terminal has a portion bent or curved towards the first semiconductor element inside the sealing body;
    the second control signal terminal has a portion bent of curved towards the second semiconductor element inside the sealing body; and
    the bent or curved portion of the temperature signal terminal and the bent or curved portion of the second control signal terminal are bent or curved in different directions from each other.

7. The semiconductor device according to claim 3, wherein:
    the second semiconductor element further includes a temperature signal electrode that outputs a signal corresponding to temperature of the second semiconductor element; and
    the temperature signal electrode of the second semiconductor element is not connected with any signal terminal.

8. The semiconductor device according to claim 3, further comprising a third semiconductor element adjacent to the other side of the first semiconductor element, wherein:
    the third semiconductor element includes a control signal electrode to which a control signal for the third semiconductor element is input; and
    the control signal electrode of the third semiconductor element is connected with a third control signal terminal included in the second signal terminal group.

9. The semiconductor device according to claim 8, wherein the second signal terminal group further includes another signal terminal between the first control signal terminal and the third control signal terminal.

10. A semiconductor device comprising:
    a first semiconductor element;
    a second semiconductor element adjacent to one side of the first semiconductor element;
    a third semiconductor element adjacent to the other side of the first semiconductor element;
    a first signal terminal group having five signal terminals; and
    a second signal terminal group that is disposed at an interval from the first signal terminal group and has six signal terminals, wherein:
    each of the first semiconductor element, the second semiconductor element, and the third semiconductor element includes:
        a control signal electrode to which a control signal for each of the first semiconductor element, the second semiconductor element, and the third semiconductor element is input;
        two temperature signal electrodes that output a signal corresponding to temperature of each of the first semiconductor element, the second semiconductor element, and the third semiconductor element; and
        two current signal electrodes that output a signal corresponding to current flowing in each of the first semiconductor element, the second semiconductor element, and the third semiconductor element,
    the two temperature signal electrodes of the first semiconductor element are connected with two temperature signal terminals included in the first signal terminal group, respectively;
    the control signal electrode of the first semiconductor element is connected with a first control signal terminal included in the second signal terminal group;
    the two current signal electrodes of the first semiconductor element are connected with two first current signal terminals, respectively, the first current signal terminals being included in the second signal terminal group and adjacent to the first control signal terminal;

the two temperature signal electrodes of the second semiconductor element are not connected with any signal terminal;

the control signal electrode of the second semiconductor element is connected with a second control signal terminal included in the first signal terminal group;

the two current signal electrodes of the second semiconductor element are connected with two second current signal terminals, respectively, the second current signal terminals being included in the first signal terminal group and positioned between the second control signal terminal and the two temperature signal terminals;

the two temperature signal electrodes of the third semiconductor element are not connected with any signal terminal;

the control signal electrode of the third semiconductor element is connected with a third control signal terminal that is included in the second signal terminal group and adjacent to the two first current signal terminals; and the two current signal electrodes of the third semiconductor element are connected with two third current signal terminals, respectively, the third current signal terminals being included in the second signal terminal group and adjacent to the third control signal terminal.

11. A semiconductor device, comprising:
a first semiconductor element;
a second semiconductor element adjacent to one side of the first semiconductor element;
a first signal terminal group; and
a second signal terminal group disposed at an interval from the first signal terminal group, wherein:
the first semiconductor element includes:
    a control signal electrode to which a control signal for the first semiconductor element is input; and
    a temperature signal electrode that outputs a signal corresponding to temperature of the first semiconductor element;
the temperature signal electrode is connected with a temperature signal terminal included in the first signal terminal group;
the control signal electrode is connected with a first control signal terminal included in the second signal terminal group;
the second semiconductor element includes a control signal electrode to which a control signal for the second semiconductor element is input;
the control signal electrode of the second semiconductor element is connected with a second control signal terminal included in the first signal terminal group;
the first signal terminal group further includes another signal terminal between the temperature signal terminal and the second control signal terminal;

the second semiconductor element further includes a current signal electrode that outputs a signal corresponding to current flowing in the second semiconductor element; and the current signal electrode of the second semiconductor element is connected with a second current signal terminal that is included in the first signal terminal group and positioned between the temperature signal terminal and the second control signal terminal.

12. The semiconductor device according to claim 11, wherein:
the first semiconductor element further includes a current signal electrode that outputs a signal corresponding to current flowing in the first semiconductor element; and
the current signal electrode is connected with a first current signal terminal included in the second signal terminal group.

13. The semiconductor device according to claim 11, wherein the temperature signal terminal and the second control signal terminal are disposed separately on both ends of the first signal terminal group, respectively.

14. The semiconductor device according to claim 11, further comprising a sealing body that seals the first semiconductor element and the second semiconductor element, wherein:
the temperature signal terminal has a portion bent or curved towards the first semiconductor element inside the sealing body;
the second control signal terminal has a portion bent of curved towards the second semiconductor element inside the sealing body; and
the bent or curved portion of the temperature signal terminal and the bent or curved portion of the second control signal terminal are bent or curved in different directions from each other.

15. The semiconductor device according to claim 11, wherein:
the second semiconductor element further includes a temperature signal electrode that outputs a signal corresponding to temperature of the second semiconductor element; and
the temperature signal electrode of the second semiconductor element is not connected with any signal terminal.

16. The semiconductor device according to claim 11, further comprising a third semiconductor element adjacent to the other side of the first semiconductor element, wherein:
the third semiconductor element includes a control signal electrode to which a control signal for the third semiconductor element is input; and
the control signal electrode of the third semiconductor element is connected with a third control signal terminal included in the second signal terminal group.

17. The semiconductor device according to claim 16, wherein the second signal terminal group further includes another signal terminal between the first control signal terminal and the third control signal terminal.

* * * * *